United States Patent [19]

Mearig

[11] 4,184,910

[45] Jan. 22, 1980

[54] SURFACE-TEXTURE FILMWORK GENERATION

[75] Inventor: Stephen G. Mearig, Columbia, Pa.

[73] Assignee: Armstrong Cork Company, Lancaster, Pa.

[21] Appl. No.: 949,750

[22] Filed: Oct. 10, 1978

[51] Int. Cl.² ............................................. C23F 1/02
[52] U.S. Cl. ............................... 430/323; 156/661.1; 156/58; 156/651
[58] Field of Search ............... 156/58, 59, 650, 651, 156/654, 655, 656, 659, 905, 661, 658, 660; 96/36, 35, 36.3, 38.1

[56] References Cited

U.S. PATENT DOCUMENTS

| | | | |
|---|---|---|---|
| 1,577,181 | 3/1926 | Crowe | 156/660 X |
| 2,009,586 | 7/1935 | McLellan | 156/905 X |
| 2,854,336 | 9/1958 | Gutknecht | 156/661 X |
| 3,711,346 | 1/1973 | Landis | 156/58 |
| 3,907,622 | 9/1975 | Otthofer | 156/651 X |

Primary Examiner—William A. Powell

[57] ABSTRACT

The invention is directed to a technique for the generation of film negatives which will be used in a chemical etching process to provide a previously etched surface with texturing on the broad, flat areas of a previously etched surface. A rubbing is used to form a basis for a series of photographic negatives which provide an indication of the different levels of texturing.

1 Claim, 2 Drawing Figures

SURFACE-TEXTURE FILMWORK GENERATION

BACKGROUND OF THE INVENTION

1. Field of the Invention

The invention is directed to a technique for reproducing a model surface by chemical etching onto an embossing plate; and, more particularly, the invention is directed to a technique for forming negatives of the texture of the surfaces of the model surface.

2. Description of the Prior Art

U.S. Pat. No. 3,907,622 teaches a technique for producing a three-dimensional effect in metal by the use of a series of photographs wit chemical etching. The invention herein is a technique for providing the product formed by that patent with surface texturing on the flat and smooth areas of the previously etched metal surface.

SUMMARY OF THE INVENTION

The invention is directed to a method for forming a three-dimensional surface wherein the initial three-dimensional surface has been formed in a series of steps using a conventional chemical etching process wherein a plurality of photographs of a model are sequentially exposed to a plurality of resist coatings to form the general shape of the three-dimensional configuration of the model in a series of steps. The above is accomplished by using the teaching of U.S. Pat. No. 3,907,622.

The improvement over that patent is the making of a rubbing of the surface of the model, whereby the rubbing forms a reproduction of the surface contour of the model with the different levels of the contour of the model being represented by a various tones of a single color. A series of photographic negatives are made of this rubbing so that the different tones of color will be reproduced in the negatives to show the different levels of texture for the model. The second set of negatives are then used very much in the same manner as the first set of negatives with a series of resist coatings applied to the previously etched step-like etched surface to provide said step-like etched surface with a texturing primarily of the flat areas of the etched surface.

This, then, converts the metal surface made by the technique of U.S. Pat. No. 3,907,622 from a step-like reproduction of the model to almost a mirror-like reproduction of the model surface.

DESCRIPTION OF THE PREFERRED EMBODIMENT

Figure 1:
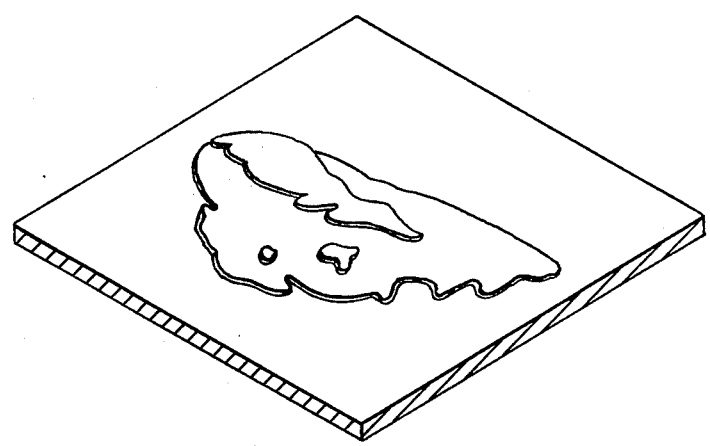
FIG. 1 is an isometric view of a model which has been formed according to the technique of U.S. Pat. No. 3,907,622.

The initial embossed metal surface is made according to the technique of U.S. Pat. No. 3,907,622, and this, then, provides a surface such as that shown in FIG. 1. It can be seen that the surface of FIG. 1 has a large number of flat areas. These flat areas must be provided with some type of texturing so that the metal surface will more nearly simulate the actual model being produced. The model being produced does not have its contour as a series of steps but as a series of curved lines.

The model is taken and on the surface thereof there is placed first a carbon paper and then a tracing paper though one could carry out the invention by simply using a tracing paper along. With the paper now positioned on the surface of the model, a pencil or some other object is rubbed across the surface of the model. The pencil alone will operate with the single piece of paper, and any type of pointed instrument can be used when the carbon paper and transfer paper are used together. Rubbing across the surface of the model with the paper thereon will produce a rubbing of the surface of the model. As is well known in the art, a rubbing is a reproduction of the surface of the irregular object with the texture or various levels of the surface being shown as different tones of the same color. For example, when the pencil rubbing is made of a three-dimensional surface, the high areas show up as being a dark color while the low areas appear as a light color.

After the rubbing of the model surface is made, the image of the rubbing is then photographed using high-contrast lithographic film to create an etching film duplicate of the rubbing. Various exposure times are employed while keeping the F-stop constant during photographing. In this manner, a series of films representing the existing levels of texture of the model can be generated for etching purposes. These films may be used as is or may be retouched to alter certain features of the model to make a more pleasing reproduction. Also the total negative may be used or only selected portions thereof.

Figure 2:
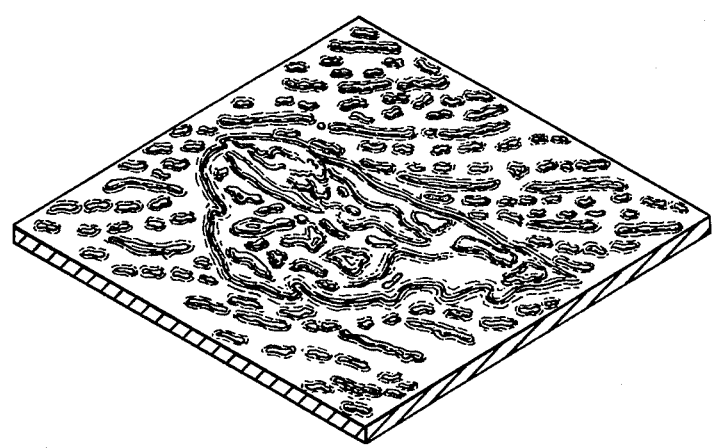
FIG. 2 is an isometric view of the model of FIG. 1 which has been now processed by the improvement technique of this application.

In one specific example of the invention, high-contrast lithographic film sold by Kodak as "Kodalith Ortho Filmtype 3 #6656" film is used with an F-11 stop and the following exposure times: 9, 14, and 17 seconds to provide three texture films. At the 9 second exposure time, the negative formed from the film will show only the very dark areas of the rubbing and at the 17 second exposure time, the negative of the film generated will show both the dark and medium tone of the rubbing. These negatives are then superimposed upon the step-like etched surface prepared according to U.S. Pat No. 3,907,622; and utilizing the resist and negative technique of that patent, a series of surface coatings are prepared for chemical etching and are chemically etched. This, then, converts the embossing plate configuration of FIG. 1 into that of FIG. 2 wherein the broad, flat areas are now provided with a texturing. In effect, the texturing technique herein converts the step-like sharp shoulder configuration of FIG. 1 into a curve surface configuration which more closely represents the true surface of the model being used.

The invention herein basically is the forming of a series of step-like impressions of the different levels of the irregular surface and then using a second set of photographing negatives to provide texturing to the flat surfaces of the different flat areas of the previously formed step-like pattern.

What is claimed is:

1. A method for forming a three-dimensional surface wherein the initial three-dimensional surface has been formed in a series of steps using a coventional chemical etching process wherein a plurality of photographs of a model are sequentially exposed to a plurality of resist coating to form the general shape of the three-dimensional configuration of the model in a series of steps, the improvement comprising:
    (a) making a rubbing of the surface of the model, said rubbing forming a reproduction of the surface contour of the model with the different levels of the contour being represented by various tones of a single color, (b) making a series of negatives of the rubbing through the use of a film type and photographic conditions which yield a series of negatives that show different levels of texture for the model, and (c) using at least parts of said negatives to form images in a series of resist coatings on the step-like etched surface to provide said step-like etched surfaces with a texturing of the flat areas of the etched surface by a chemical etching operation.

* * * * *